(12) United States Patent
Cho et al.

(10) Patent No.: US 11,961,852 B2
(45) Date of Patent: Apr. 16, 2024

(54) MANUFACTURE METHOD OF ARRAY SUBSTRATE, ARRAY SUBSTRATE, AND DISPLAY PANEL

(71) Applicants: HKC CORPORATION LIMITED, Shenzhen (CN); CHUZHOU HKC OPTOELECTRONICS TECHNOLOGY CO., LTD., Chuzhou (CN)

(72) Inventors: En-Tsung Cho, Shenzhen (CN); Fengyun Yang, Shenzhen (CN); Yuming Xia, Shenzhen (CN); Je-Hao Hsu, Shenzhen (CN); Zhen Liu, Shenzhen (CN); Hejing Zhang, Shenzhen (CN); Wanfei Yong, Shenzhen (CN)

(73) Assignees: HKC CORPORATION LIMITED, Shenzhen (CN); CHUZHOU HKC OPTOELECTRONICS TECHNOLOGY CO., LTD., Chuzhou (CN)

(*) Notice: Subject to any disclaimer, the term of this patent is extended or adjusted under 35 U.S.C. 154(b) by 473 days.

(21) Appl. No.: 17/229,396

(22) Filed: Apr. 13, 2021

(65) Prior Publication Data
US 2021/0233943 A1 Jul. 29, 2021

Related U.S. Application Data

(63) Continuation of application No. PCT/CN2020/095263, filed on Jun. 10, 2020.

(30) Foreign Application Priority Data

Jun. 11, 2019 (CN) .......................... 201910504742.0

(51) Int. Cl.
*H01L 27/12* (2006.01)
*H01L 21/311* (2006.01)
*H01L 21/3213* (2006.01)

(52) U.S. Cl.
CPC ........ *H01L 27/1288* (2013.01); *H01L 27/127* (2013.01); *H01L 21/31138* (2013.01);
(Continued)

(58) Field of Classification Search
None
See application file for complete search history.

(56) References Cited

U.S. PATENT DOCUMENTS 9,804,464 B2 * 10/2017 Gao ................. G02F 1/133345
2004/0046924 A1 3/2004 Kim et al.
(Continued)

FOREIGN PATENT DOCUMENTS

CN 103489873 A 1/2014
CN 103887165 A 6/2014
(Continued)

OTHER PUBLICATIONS

Translation of KR102010393B1 for KR20140128551, Array substrate for transverse electric field type liquid crystal display device and method of manufacturing the same, Sep. 21, 2023, Ahn et al for LG Display Co LTD, pp. 1-57. (Year: 2023).*
(Continued)

*Primary Examiner* — Michelle Mandala
(74) *Attorney, Agent, or Firm* — Westbridge IP LLC

(57) ABSTRACT

Disclosed is a manufacture method of the array substrate, including: sequentially forming a gate, a gate insulating layer, an active layer, an ohmic contact layer and a metal layer on a substrate, forming a photoetching mask on the metal layer, where thickness of the photoetching mask in a half exposure area of the mask plate is from 2000 Å to 6000
(Continued)

Å; etching the metal layer, the ohmic contact layer and the active layer outside a covering area of the photoetching mask; ashing the photoetching mask for a preset time with an ashing reactant, wherein the ashing reactant comprises oxygen, and the preset time is from 70 seconds to 100 seconds; and sequentially etching the metal layer, the ohmic contact layer and the active layer based on the ashed photoetching mask, and forming a channel region of the array substrate. The present disclosure further discloses an array substrate, and a display panel.

20 Claims, 7 Drawing Sheets

(52) U.S. Cl.
CPC .. *H01L 21/32134* (2013.01); *H01L 21/32135* (2013.01); *H01L 21/32139* (2013.01)

(56) References Cited

U.S. PATENT DOCUMENTS

| | | | |
|---|---|---|---|
| 2006/0180814 A1 | 8/2006 | Kim | |
| 2007/0082435 A1 | 4/2007 | Lai et al. | |
| 2010/0099205 A1* | 4/2010 | Kim | H01L 27/12 438/22 |
| 2016/0197165 A1* | 7/2016 | Kim | H01L 21/30604 438/163 |
| 2019/0326335 A1* | 10/2019 | Liu | H01L 27/127 |

FOREIGN PATENT DOCUMENTS

| | | | | |
|---|---|---|---|---|
| CN | 105161454 A | 12/2015 | | |
| CN | 107481934 A | 12/2017 | | |
| CN | 108417583 A | 8/2018 | | |
| CN | 108447821 A | 8/2018 | | |
| CN | 109786335 A | 5/2019 | | |
| CN | 110335871 A | 10/2019 | | |
| KR | 20140128551 A | * | 11/2014 | ....... G02F 1/134363 |

OTHER PUBLICATIONS

First Office Action issued in counterpart Chinese Patent Application No. 201910504742.0, dated Feb. 19, 2021.

International Search Report and Written Opinion issued in corresponding PCT Application No. PCT/CN2020/095263, dated Sep. 4, 2020.

Second Office Action issued in counterpart Chinese Patent Application No. 201910504742.0, dated Apr. 19, 2021.

Grant Notification issued in counterpart Chinese Patent Application No. 201910504742.0, dated Sep. 24, 2021.

Xu et al., Ashing Mechanism of Photo-Resist in Oxygen-Sulfur Hexafluoride Mixtures, Chinese Journal of Vacuum Science and Technology, 2012, 32(12), pp. 1109-1113, dated Dec. 15, 2012.

Zheng et al., Research on Reactive Ion Etching of PR in O2/SF6 Mixtures, Advanced Display, 2007, 80, pp. 41-44, dated Oct. 15, 2007.

* cited by examiner

MANUFACTURE METHOD OF ARRAY SUBSTRATE, ARRAY SUBSTRATE, AND DISPLAY PANEL

CROSS REFERENCE TO RELATED APPLICATIONS

The present disclosure is a continuation application of PCT application No. PCT/CN2020/095263, filed Jun. 10, 2020, which claims priority to Chinese patent application No.201910504742.0, filed Jun. 11, 2019 and entitled "Manufacture method of array substrate, array substrate, and display panel". The disclosures of the aforementioned applications are hereby incorporated by reference in their entireties.

TECHNICAL FIELD

The present disclosure relates to the technical field of thin film transistors, in particular to a manufacture method of an array substrate, an array substrate, and a display panel.

BACKGROUND

The liquid crystal display trends to become a mainstream in current market share, and by principle the liquid crystal which is driven by current deflects to allow light to easily pass through and display image. The array substrate with thin film transistor includes a metal layer and an amorphous silicon layer (active layer). Amorphous silicon (A-Si) is currently the most widely used material for semiconductor layer in industry. However, it is difficult to form ohmic contact when A-Si material contacts with metal because of its large potential energy difference. In practice, in order to obtain the ohmic contact between metal and semiconductor, an ohmic contact layer is usually formed between the metal layer and the amorphous silicon layer, to reduce contact resistance between the metal and the semiconductor, and improve a current efficiency.

In the related art, when manufacturing a thin film transistor array substrate by a four-mask process, oxide residues are easily formed when etching the metal layer that corresponds to the channel region (mask half exposure region), and creating residues of ohmic contact layer when etching the ohmic contact layer. It would bring an unstable array substrate with a local short circuit or other problems, affecting the display performance in a negative way.

The statements herein merely provide background information related to the present disclosure and do not necessarily constitute prior art.

SUMMARY

The present disclosure provides a manufacture method of an array substrate, which includes the following operations:

sequentially forming a gate, a gate insulating layer, an active layer, an ohmic contact layer and a metal layer on a substrate, forming a photoetching mask on the metal layer, wherein thickness of the photoetching mask in a half exposure area of the mask plate is from 2000 Å to 6000 Å;

etching the metal layer, the ohmic contact layer and the active layer outside a covering area of the photoetching mask;

ashing the photoetching mask for a preset time with an ashing reactant, where the ashing reactant comprises oxygen, and the preset time is from 70 seconds to 100 seconds; and sequentially etching the metal layer, the ohmic contact layer and the active layer based on the ashed photoetching mask, and forming a channel region of the array substrate.

In order to achieve the above purpose, the present disclosure also provides an array substrate, which is manufactured by the aforementioned method.

In order to achieve the above purpose, the present disclosure also provides a display panel, which is manufactured and formed based on the array substrate as described above.

According to the manufacture method of the array substrate of the present application, the method includes: sequentially forming a gate, a gate insulating layer, an active layer, an ohmic contact layer and a metal layer on a substrate, forming a photoetching mask on the metal layer, wherein thickness of the photoetching mask in a half exposure area of the mask plate is from 2000 Å to 6000 Å; etching the metal layer, the ohmic contact layer and the active layer outside a covering area of the photoetching mask; ashing the photoetching mask for a preset time with an ashing reactant, wherein the ashing reactant comprises oxygen, and the preset time is from 70 seconds to 100 seconds; and sequentially etching the metal layer, the ohmic contact layer and the active layer based on the ashed photoetching mask, and forming a channel region of the array substrate. As such, it is resolved that oxide residue tends to form when the metal layer is formed in the corresponding channel region, and it further resolves the problem that the ohmic contact layer is further remained when etching the ohmic contact layer. A well-manufactured ohmic contact layer can be finally obtained, and a local short circuit of the end product array substrate which may affect the display performance negatively is avoided, improving the stability of an array substrate.

The implementation, functional characteristics and advantages of the present disclosure will be further described with reference to the attached drawings in combination with embodiments.

DETAILED DESCRIPTION OF THE EMBODIMENTS

It should be understood that the specific embodiments described herein are only for illustrative purpose and are not intended to limit the present disclosure.

The present disclosure provides a manufacture method of an array substrate. It is resolved that oxide residue tends to form when the metal layer is formed in the corresponding channel region, and it further resolves the problem that the ohmic contact layer is further remained when etching the ohmic contact layer. A well-manufactured ohmic contact layer can be finally obtained, and a local short circuit of the end product array substrate which may affect the display performance negatively is avoided, improving the stability of the array substrate.

Figure 1:
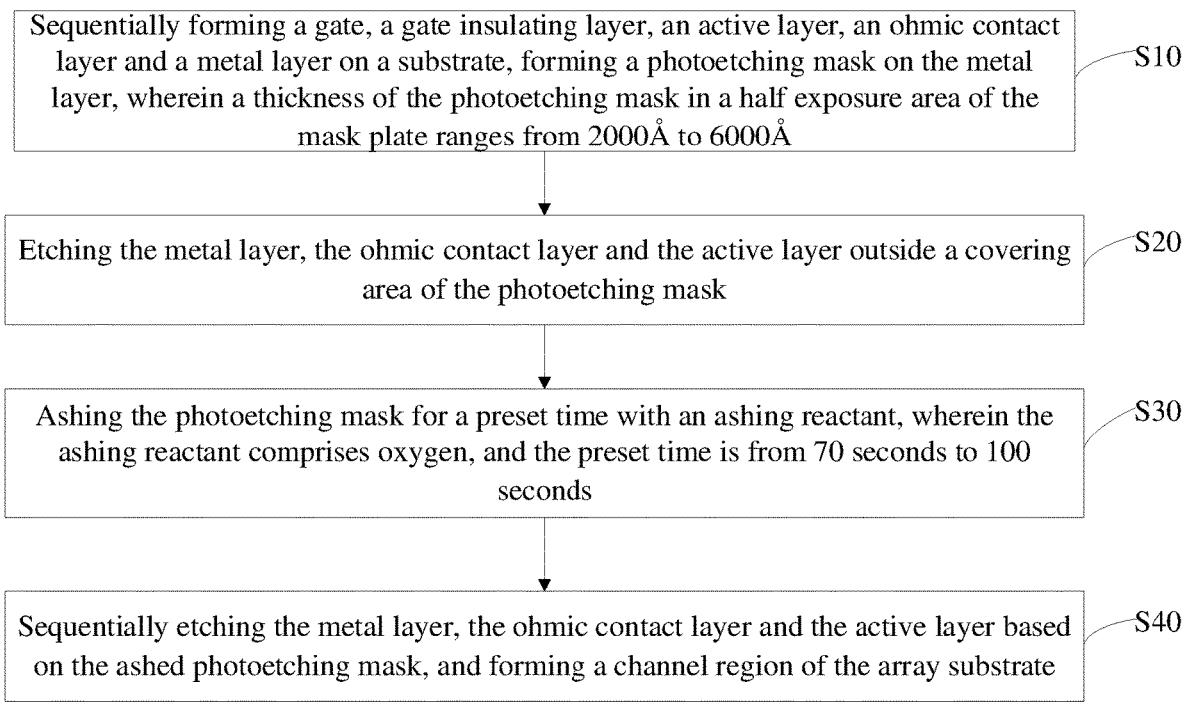
FIG. 1 is a schematic flow chart of a manufacture method of an array substrate according to a first embodiment of the present disclosure.

Referring to FIG. 1, in some embodiment, the manufacture method of an array substrate includes:

operation S10, sequentially forming a gate, a gate insulating layer, an active layer, an ohmic contact layer and a metal layer on a substrate, forming a photoetching mask on the metal layer, where thickness of the photoetching mask in a half exposure area of a mask plate ranges from 2000 Å to 6000 Å.

In the present embodiment, the ohmic contact layer (doped amorphous silicon layer, N+A-Si) disposed between the active layer (amorphous silicon layer, A-Si) and the metal layer in the thin film transistor array substrate can be either an N-type ohmic contact layer or a P-type ohmic contact layer.

Figure 4:
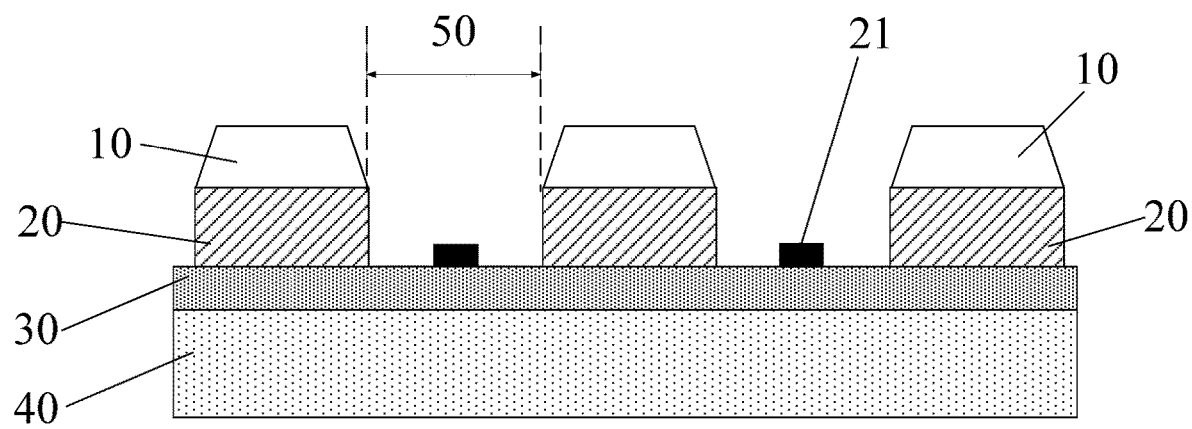
FIG. 4 is an exemplary diagram illustrating oxide residue in a manufacture method of an array substrate according to an embodiment of the present disclosure.
Figure 5:
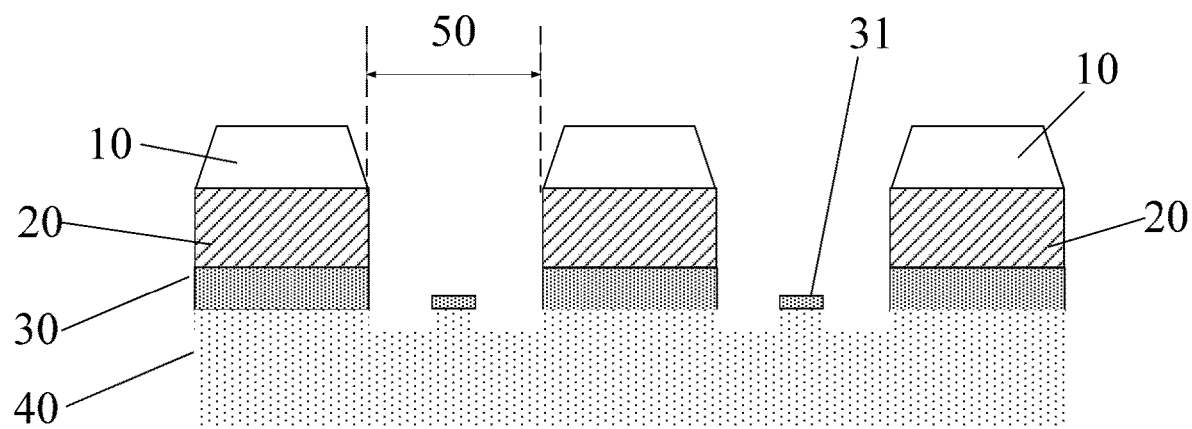
FIG. 5 is an exemplary diagram illustrating residue of the ohmic contact layer in a manufacture method of an array substrate according to an embodiment of the present disclosure.

Referring to FIG. 4, in manufacturing the array substrate by a 4-mask process (4-step photoetching process), the metal layer 20, the ohmic contact layer 30, and the active layer 40 in the half exposure area 50 of the mask plate are sequentially etched to form the channel region of the array substrate. The metal in the metal layer during the process easily reacts with oxygen, forming oxide residue 21 on the surface of the ohmic contact layer 30 (the ohmic contact layer corresponding to the channel region does not start etching yet). With reference to FIG. 5, when the ohmic contact layer 30 and the active layer 40 are etched afterwards, residue of the ohmic contact layer 31 is formed at the covering area corresponding to the oxide residue, which further negatively affects the etching of the active layer covered by the covering area corresponding to the ohmic contact layer residue 31. As such, the finally formed active layer is uneven on its surface corresponding to the channel region at the channel's cross-section width, resulting in an unstable array substrate which may probably have local short circuit and other problems, and affects the display performance.

When manufacturing a thin film transistor array substrate, a substrate and a gate are formed first. A gate insulating layer covering the gate is deposited on the substrate by chemical vapor deposition, followed by sequential deposition of an active layer, an ohmic contact layer and a metal layer on the gate insulating layer.

It should be noted that the metal layer can be a stack of one or more of manganese, molybdenum, titanium, aluminum and copper. The active layer can be made of A-Si. The gate insulating layer can be silicon oxide and/or silicon nitride. The gate electrode can be a stack of one or more of molybdenum, titanium, aluminum and copper. The base substrate can be a glass substrate.

Figure 6:
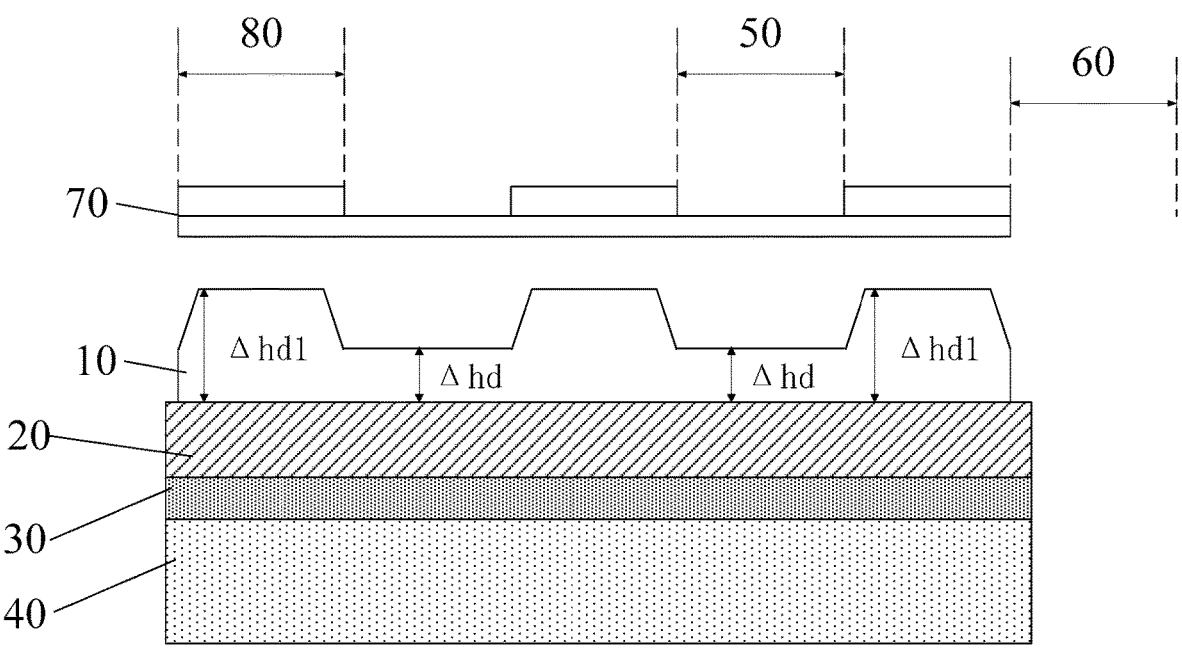
FIG. 6 is an exemplary diagram illustrating a photoetching mask after exposure in a manufacture method of an array substrate according to an embodiment of the present disclosure.

Referring to FIG. 6, after the metal layer 20 is deposited on the ohmic contact layer 30, photoresist is coated on the metal layer 20. The photoresist is exposed via the mask 70.

Specifically, the photoresist corresponding to the mask exposure area 60 is completely exposed, and the photoresist corresponding to the half exposure area 50 is partially exposed, while the photoresist corresponding to the mask unexposure area 80 is basically unaffected by light exposure. Then dry etching is conducted to the exposed photoresist with 02, so as to etch off the photoresist affected by illumination. According to FIG. 5, a photoetching mask 10 is formed on the metal layer 20. After etching the photoresist corresponding to the half exposure area 50, the thickness δ hd of the photoetching mask 10 in the half exposure area 50 is a preset thickness. The preset thickness ranges from 2000 Å to 6000 Å (0.2 um to 0.6 um), and the preset thickness can be selected from 2500 Å, 3000 Å, 3700 Å, 4200 Å, 4300 Å, 4700 Å or 4800 Å. It should be noted that the mask 70 can be a single slit mask or a double slit mask.

It should be noted that the channel region of the finally formed array substrate corresponds to the half exposure region of the mask plate.

In some embodiment, when setting parameters for photoetching exposure, the thickness of the mask plate in the half exposure area after the formation of the photoetching mask 10 can be adjusted by a calorific value of the Photo Dose Energy of the mask plate for the half exposure area. Photoresist is coated on the metal layer, and exposed on a mask plate with a preset photo dose energy, so as to form the photoetching mask 10 on the metal layer. The preset dose is from 35 MJ to 45 MJ. For example, by setting the light dose energy of 41.5 MJ, the preset thickness of the photoetching mask 10 in the channel region can be adjusted to 5000 Å.

In some embodiment, when the retention thickness of the photoresist layer is greater than or equal to 4000 Å, the required light dose energy increases 1.5 MJ at decreasing the retention thickness of the photoresist by 1000 Å. In some embodiment, when the retention thickness of the photoresist layer is less than 4000 Å and greater than or equal to 2000 Å, the required light dose energy is 2.5 MJ when the retention thickness of the photoresist layer is reduced by 1000 Å each time.

Further, the uniformity of the photoetching mask in the channel region is controlled to reach a preset uniformity, which is from 20% to 40%. In some embodiment, referring to FIG. 6, the thickness Δhd1 of the island structure part of the photoetching mask 10 corresponding to the non-exposure area 80 of the mask plate ranged from 18000 A to 22000 A, if a photoetching mask 10 with a thickness ranging from 2000 Å to 6000 Å, would be formed in the channel region. In some embodiment, the thickness Δhd1 is 22000 Å. As such, by forming a photoetching mask with a thickness ranging from 2000 Å to 6000 Å in the half exposure area of the mask plate and an thickness ranging from 18000 Å to 22000 Å in the island structure part outside the half exposure area of the mask plate, the uniformity of the photoetching mask can be improved, so as to reach 20% to 40%.

It should be noted that the formed photoresist layer may have poor uniformity after applied. And when etching the exposed photoresist layer to form a photoetching mask, the film thickness of the photoetching mask may be uneven due to factors such as the etching rate. Therefore, by forming the photoetching mask with the thickness reaching the preset thickness in the half exposure area of the mask plate, the influence on the etching of the metal layer and amorphous silicon layer caused by the non-uniformity of the film thickness of the photoetching mask in the subsequent 4-mask process can be avoided. Further, excessive ashing time caused by excessive thickness of the photoetching mask in the half exposure area of the mask plate can also be avoided, the excessive ashing time may result in excessive loss of the photoetching mask outside the half exposure area of the mask plate.

Operation S20, etching the metal layer, the ohmic contact layer and the active layer outside a covering area of the photoetching mask.

After forming a photoetching mask on the metal layer, based on the photoetching mask, sequentially etching the metal layer, the ohmic contact layer and the active layer outside the covering area of the photoetching mask. Specifically, the metal layer outside a coverage of the photoetching mask is wet etched based on the photoetching mask, and an exposed ohmic contact layer and an exposed the active layer are sequentially dry etched.

Particularly, the metal layer may be wet etched with mixed compounds including phosphoric acid $H_3PO_4$, acetic acid $CH_3COOH$ and nitric acid $HNO_3$. When the ohmic contact layer and the active layer are dry etched firstly, the amorphous silicon layer may be dry etched with a first mixed gas including sulfur hexafluoride $SF_6$ and chlorine $Cl_2$.

Operation S30, ashing the photoetching mask for a preset time with an ashing reactant, wherein the ashing reactant comprises oxygen, and the preset time is from 70 seconds to 100 seconds.

Figure 7:
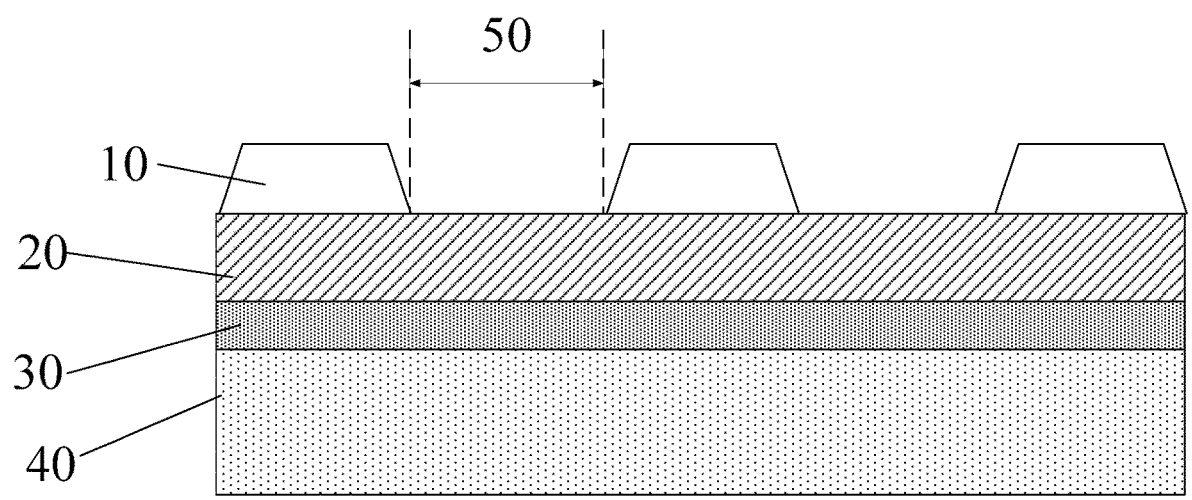
FIG. 7 is an exemplary diagram illustrating a photoetching mask after ashing in a manufacture method of an array substrate according to an embodiment of the present disclosure.

In some embodiment, the ashing reactant includes oxygen $O_2$, and the reactant dose of oxygen is 8000 sccm to 10000 sccm, and the preset time is 70 seconds to 100 seconds. In some embodiment, when oxygen is used for the ashing reaction, the reaction time (preset time) can be from 84 seconds to 95 seconds. That is, the photoetching mask is ashed for 84 seconds to 95 seconds with oxygen of 8000 sccm to 10000 sccm, as shown in FIG. 7, to remove the photoetching mask in the corresponding area of the channel region (corresponding to the half exposure area 50), so that the surface of the metal layer 20 in the half exposure area 50 is exposed.

In some embodiment, when the photoetching mask is ashed with oxygen of 8000 sccm to 10000 sccm for 84 seconds to 95 seconds, the thickness of the preformed photoetching mask in the half exposure area 50 of the mask plate ranges from 4600 Å to 6000 Å. As such, the thickness of the formed photoetching mask 10 in the channel region reaches a certain thickness, and more oxygen can be consumed when ashing the photoetching mask 10. The oxygen is reduced in entire manufacture of the array substrate, reducing the possibility of forming oxide residues on the surface of the metal layer.

Operation S40, sequentially etching the metal layer, the ohmic contact layer and the active layer based on the ashed photoetching mask, and forming a channel region of the array substrate.

The metal layer, ohmic contact layer and active layer are etched for a second time based on the ashed photoetching mask. Specifically, the metal layer outside the coverage area of the photoetching mask is wet etched, where the channel region corresponds to the metal layer (i.e., the part corresponding to the half exposure area of the original mask plate where the mask plate has been removed) is etched to form the source and drain of the metal layer, and the corresponding exposed ohmic contact layer. Afterwards, dry etching is carried out on the ohmic contact layer and the active layer outside the covering area of the metal layer, based on the ashed photoetching mask and the wet-etched metal layer. And finally the channel region of the array substrate (the region corresponding to the half exposure region of the mask plate) is formed.

More specifically, the metal layer may be wet etched with mixed compounds including phosphoric acid $H_3PO_4$, acetic acid $CH_3COOH$ and nitric acid $HNO_3$. When the ohmic contact layer and the active layer are dry etched for the second time, the amorphous silicon layer may be dry etched with a second mixed gas including sulfur hexafluoride $SF_6$, and chlorine $Cl_2$, and helium gas He.

After the metal layer covers the active layer except for area of the channel region, the remaining photoetching mask is stripped off to form the thin film transistor array substrate which includes the base substrate, the gate, the gate insulating layer, and the patterned ohmic contact layer, the active layer and the metal layer.

It should be noted that in the subsequent process for manufacturing the array substrate, a passivation layer is formed, covering the patterned ohmic contact layer, active layer and metal layer, so as to further form a pixel layer forming a passivation via hole through the passivation layer on the gate insulating layer of the array substrate. The thin film transistor array substrate is formed.

In some embodiment, the formed thin film transistor array substrate can be used for a display panel.

According to some embodiment of the present disclosure, the method includes: sequentially forming a gate, a gate insulating layer, an active layer, an ohmic contact layer and a metal layer on a substrate, forming a photoetching mask on the metal layer, where thickness of the photoetching mask in a half exposure area of the mask plate is from 2000 Å to 6000 Å; etching the metal layer, the ohmic contact layer and the active layer outside a covering area of the photoetching mask; ashing the photoetching mask for a preset time with an ashing reactant, where the ashing reactant includes oxygen, and the preset time is from 70 seconds to 100 seconds; and sequentially etching the metal layer, the ohmic contact layer and the active layer based on the ashed photoetching mask, and forming a channel region of the array substrate. As such, it is resolved that oxide residue tends to form when the metal layer is formed in the corresponding channel region, and the problem that the ohmic contact layer is further remained when etching the ohmic contact layer. A well-manufactured ohmic contact layer can be finally obtained, and a local short circuit of the end product array substrate which may negatively affect the display performance is avoided, improving the stability of the array substrate.

Figure 2:
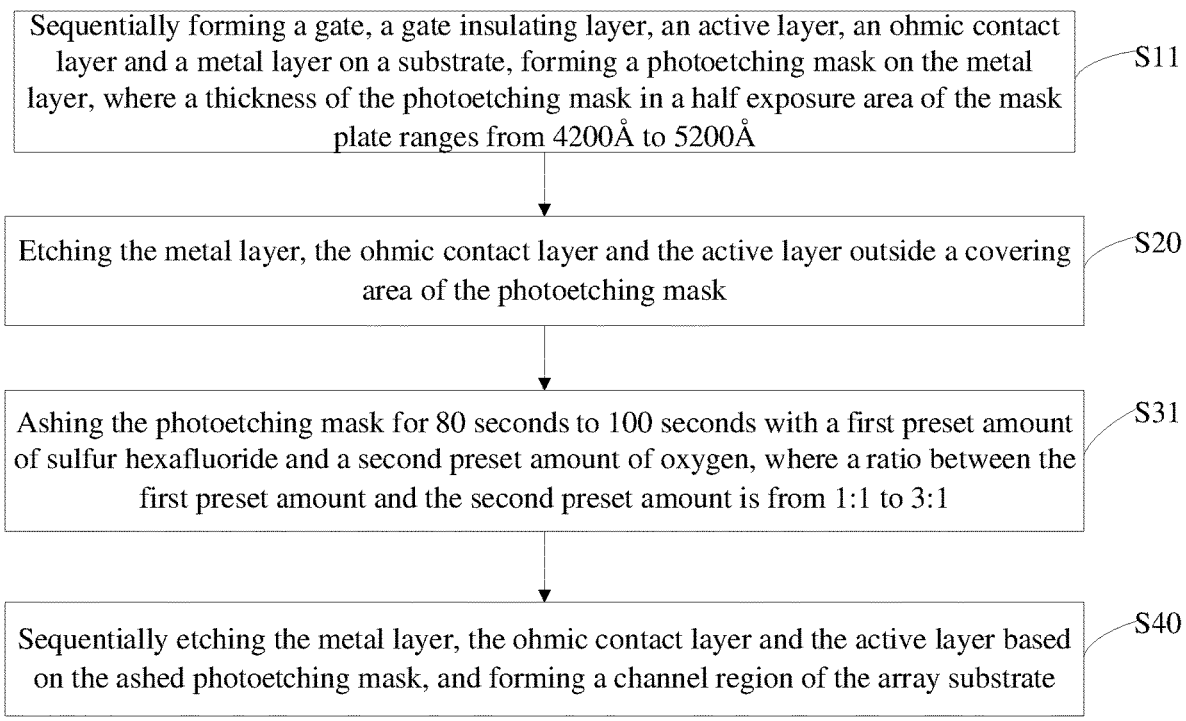
FIG. 2 is a schematic flow chart of a manufacture method of an array substrate according to a second embodiment of the present disclosure.

In some other embodiment, as shown in FIG. 2, based on above embodiment shown in FIG. 1, the manufacture method of the array substrate further includes:

operation S11, sequentially forming a gate, a gate insulating layer, an active layer, an ohmic contact layer and a metal layer on a substrate, forming a photoetching mask on the metal layer, where thickness of the photoetching mask in the half exposure area of the mask plate ranges from 4200 Å to 5200 Å.

Operation S31, ashing the photoetching mask for 80 seconds to 100 seconds with mixed compounds including a first preset amount of sulfur hexafluoride and a second preset amount of oxygen, where a ratio between the first preset amount and the second preset amount is from 1:1 to 3:1.

In the present embodiment, a photoetching mask with a thickness ranging from 4200 Å to 5200 Å is formed in the corresponding area of the channel region. The metal layer, the ohmic contact layer and the active layer outside the coverage of the photoetching mask are then etched based on the photoetching mask. The photoetching mask is ashed for 80 seconds to 100 seconds with a mixture of a first preset amount of sulfur hexafluoride $SF_6$ and a second preset amount of oxygen $O_2$, where the ratio between the first preset amount and the second preset amount ranges from 1:1 to 3:1 (i.e., $SF_6$: $O_2$=1 to $SF_6$: $O_2$=3).

In some embodiment, the first preset amount is from 10000 sccm to 24000 sccm, and the second preset amount is from 8000 sccm to 10000 sccm. That is, a mixture containing oxygen ranging from 8000 sccm to 10000 sccm and sulfur hexafluoride $SF_6$ ranging from 10000 sccm to 24000 sccm are used to ash the photoetching mask for 80 seconds to 100 seconds, so as to remove the photoetching mask corresponding to the area of the channel region and expose the surface of the metal layer corresponding to the area of the channel region.

As such, sulfur hexafluoride $SF_6$ will react with excessive oxygen, and consume more oxygen when ashing the photoetching mask, to reduce the oxygen in the manufacture of the entire array substrate, and the possibility of forming oxide residues on the surface of the metal layer.

Figure 3:
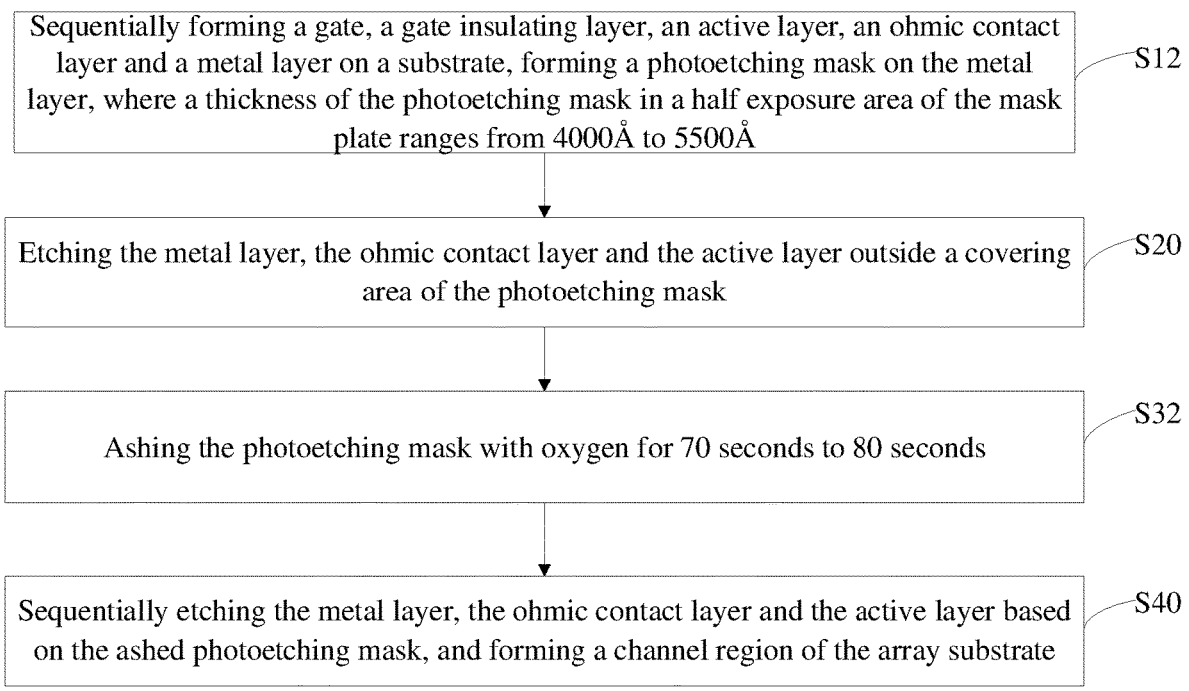
FIG. 3 is a schematic flow chart of a manufacture method of an array substrate according to a third embodiment of the present disclosure.

In some other embodiment, as shown in FIG. 3, based on the above embodiments regarding FIGS. 1 to 2, the manufacture method of the array substrate further includes:

operation S12, sequentially forming a gate, a gate insulating layer, an active layer, an ohmic contact layer and a metal layer on a substrate, forming a photoetching mask on the metal layer, where thickness of the photoetching mask in the half exposure area of the mask plate ranges from 4000 A to 5500 A.

Operation S32, ashing the photoetching mask with oxygen for 70 seconds to 80 seconds.

In the present embodiment, a photoetching mask with a thickness ranging from 4000 Å to 5500 Å is formed corresponding to the area of the channel region, and the metal layer, ohmic contact layer and active layer outside the coverage range of the photoetching mask are etched based on the photoetching mask. The photoetching mask is ashed with oxygen for 70 to 80 seconds to remove the photoetching mask in the corresponding range of the channel region, wherein the reactive dose of oxygen is from 8000 to 10000 sccm. That is, 8000 sccm to 10000 sccm of oxygen is used to ash the photoetching mask for 70 seconds to 80 seconds for removing the photoetching mask in the corresponding area to the channel region, so that the surface of the metal layer in the corresponding range of the channel region is exposed.

As such, by reducing the reaction time of oxygen in the ashing process to 70 seconds to 80 seconds, the oxygen in the manufacture of the entire array substrate can be reduced, which reduces the possibility of forming oxide residues on the surface of the metal layer.

In addition, the present disclosure also provides an array substrate, which is manufactured by the aforementioned method.

In addition, the present disclosure also provides a display panel, which is manufactured based on the array substrate as described above.

The aforementioned serial numbers regarding the embodiments of the present disclosure are for description only and do not represent the superiority and inferiority of the embodiments.

From the above description of the embodiments, those skilled in the art can clearly understand that the method of the above embodiments can be implemented by means of software plus necessary general-purpose hardware platforms. Of course, it can also be implemented by means of hardware, but in many cases the former is better. Based on this appreciation, the technical solution of the present disclosure, in essence, or the part contributing to the related art, can be embodied in the form of a software product stored in a storage medium (such as ROM/RAM, magnetic disk, diskette) as described above, including several instructions to cause a terminal device (which can be a mobile phone, computer, server, air conditioner, or network device, etc.) to perform the methods described in various embodiments of the present disclosure.

The description aforementioned is only the optional embodiment of the present disclosure and is not intended to limit the scope of the present disclosure. Any equivalent structural or flow modification made by using the description and drawings of the present disclosure or direct/indirect application in other related technical fields under the concept of the present disclosure shall be included in the protection scope of the present disclosure.

What is claimed is:

1. A manufacture method of an array substrate, comprising:
    sequentially forming a gate, a gate insulating layer, an active layer, an ohmic contact layer and a metal layer on a substrate, forming a photoetching mask on the metal layer, wherein a thickness of the photoetching mask in a half exposure area of a mask plate is from 2000 Å to 6000 Å;
    etching the metal layer, the ohmic contact layer and the active layer outside a covering area of the photoetching mask;
    ashing the photoetching mask for a preset time with an ashing reactant, wherein the ashing reactant comprises oxygen and sulfur hexafluoride, the preset time is from 70 seconds to 100 seconds, and a gas volume ratio between a first preset amount of sulfur hexafluoride and a second preset amount of oxygen is from 1:1 to 3:1; and
    sequentially etching the metal layer, the ohmic contact layer and the active layer based on the ashed photoetching mask, and forming a channel region of the array substrate.

2. The manufacture method of claim 1, wherein the operation of ashing on the photoetching mask for a preset time with an ashing reactant comprises:
    ashing the photoetching mask for 80 seconds to 100 seconds.

3. The method of claim 2, wherein the first preset amount is from 10000 sccm to 24000 sccm, and the second preset amount is from 8000 sccm to 10000 sccm.

4. The method of claim 2, wherein prior to the operation of ashing the photoetching mask for 80 seconds to 100 seconds with a first preset amount of sulfur hexafluoride and a second preset amount of oxygen, the method further comprises:
    forming the photoetching mask on the metal layer, wherein the thickness of the photoetching mask formed on the metal layer in the half exposure area of the mask plate is from 4200 Å to 5200 Å.

5. The method of claim 1, wherein the operation of ashing the photoetching mask for a preset time with an ashing reactant comprises:
    ashing the photoetching mask with oxygen for 70 to 80 seconds.

6. The method of claim 5, wherein prior to the operation of ashing the photoetching mask with oxygen for 70 seconds to 80 seconds, the method further comprises:
    forming the photoetching mask on the metal layer, wherein the thickness of the photoetching mask formed on the metal layer in the half exposure area of the mask plate ranges from 4000 Å to 5500 Å.

7. The method of claim 1, wherein prior to the operation of ashing the photoetching mask for a preset time with an ashing reactant, the method further comprises:
forming the photoetching mask on the metal layer, wherein the thickness of the photoetching mask formed on the metal layer in the half exposure area of the mask plate ranges from 4600 Å to 6000 Å, and
the operation of ashing the photoetching mask for a preset time with an ashing reactant comprises:
ashing the photoetching mask with oxygen for 84 to 95 seconds.

8. The method of claim 1, wherein the operation of forming a photoetching mask on the metal layer comprises:
coating photoresist on the metal layer;
exposing the photoresist based on the mask plate and a photo energy in a preset dose;
forming the photoetching mask on the metal layer; and
controlling uniformity of the photoetching mask in the half exposure area of the mask plate to reach preset uniformity, wherein,
the preset uniformity is from 20% to 40%, and the preset dose is from 35 MJ to 45 MJ.

9. An array substrate, manufactured by a method comprising:
sequentially forming a gate, a gate insulating layer, an active layer, an ohmic contact layer and a metal layer on a substrate, forming a photoetching mask on a metal layer, wherein a thickness of the photoetching mask in a half exposure area of the mask plate is from 2000 Å to 6000 Å;
etching the metal layer, the ohmic contact layer and the active layer outside a covering area of the photoetching mask;
ashing the photoetching mask for a preset time with an ashing reactant, wherein the ashing reactant comprises oxygen and sulfur hexafluoride, the preset time is from 70 seconds to 100 seconds, and a gas volume ratio between a first preset amount of sulfur hexafluoride and a second preset amount of oxygen is from 1:1 to 3:1; and
sequentially etching the metal layer, the ohmic contact layer and the active layer based on the ashed photoetching mask, and forming a channel region of the array substrate.

10. The array substrate of claim 9, wherein the metal layer comprises a stack of one or more of manganese, molybdenum, titanium, aluminum and copper;
the active layer is made of amorphous silicon;
the gate insulating layer is silicon oxide and/or silicon nitride;
the gate comprises a stack of one or more of molybdenum, titanium, aluminum and copper; and
the base substrate comprises a glass substrate.

11. The array substrate of claim 10, wherein the operation of etching the metal layer, the ohmic contact layer and the active layer outside a covering area of the photoetching mask comprises:
wet etching the metal layer outside a covering area of the photoetching mask based on the photoetching mask, and
sequentially dry etching an exposed ohmic contact layer and an exposed the active layer.

12. The array substrate of claim 11, wherein the operation of wet etching the metal layer outside a covering area of the photoetching mask based on the photoetching mask, and sequentially dry etching an exposed ohmic contact layer and an exposed the active layer comprises:
wet etching the metal layer with a mixture, wherein the mixture comprises phosphoric acid, acetic acid and nitric acid; and
dry etching the metal layer with a first mixed gas when dry etching the ohmic contact layer and the active layer for a first time, wherein the first mixed gas comprises sulfur hexafluoride and chlorine.

13. The array substrate of claim 9, wherein the operation of sequentially etching the metal layer, the ohmic contact layer and the active layer based on the ashed photoetching mask, and forming a channel region of the array substrate comprises:
wet etching the metal layer outside a covering area of the photoetching mask, and
dry etching the ohmic contact layer and the active layer outside a covering area of the metal layer, and forming a channel region of the array substrate.

14. The array substrate of claim 13, wherein the operation of wet etching the metal layer outside a covering area of the photoetching mask, and dry etching the ohmic contact layer and the active layer outside a covering area of the metal layer comprises:
wet etching the metal layer with a mixture, wherein the mixture comprises phosphoric acid, acetic acid and nitric acid; and
dry etching the metal layer with a second mixed gas when dry etching the ohmic contact layer and the active layer for a second time, wherein the second mixed gas comprises sulfur hexafluoride, chlorine and helium.

15. A display panel, comprising an array substrate which is manufactured by operations comprising:
sequentially forming a gate, a gate insulating layer, an active layer, an ohmic contact layer and a metal layer on a substrate, forming a photoetching mask on the metal layer, wherein thickness of the photoetching mask in a half exposure area of the mask plate is from 2000 Å to 6000 Å;
etching the metal layer, the ohmic contact layer and the active layer outside a covering area of the photoetching mask;
ashing the photoetching mask for a preset time with an ashing reactant, wherein the ashing reactant comprises oxygen and sulfur hexafluoride, the preset time is from 70 seconds to 100 seconds, and a gas volume ratio between a first preset amount of sulfur hexafluoride and a second preset amount of oxygen is from 1:1 to 3:1; and
sequentially etching the metal layer, the ohmic contact layer and the active layer based on the ashed photoetching mask, and forming a channel region of the array substrate.

16. The display panel of claim 15, wherein the operation of ashing on the photoetching mask for a preset time with an ashing reactant comprises:
ashing the photoetching mask for 80 seconds to 100 seconds.

17. The display panel of claim 16, wherein the first preset amount is from 10000 sccm to 24000 sccm, and the second preset amount is from 8000 sccm to 10000 sccm.

18. The display panel of claim 16, wherein prior to the operation of ashing the photoetching mask for 80 seconds to 100 seconds with a first preset amount of sulfur hexafluoride and a second preset amount of oxygen, the method further comprises:
   forming the photoetching mask on the metal layer, wherein
   the thickness of the photoetching mask in the half exposure area of the mask plate ranges from 4200 Å to 5200 Å.

19. The display panel of claim 15, wherein the operation of ashing the photoetching mask for a preset time with an ashing reactant comprises:
   ashing the photoetching mask with oxygen for 70 to 80 seconds.

20. The display panel of claim 19, wherein prior to the operation of ashing the photoetching mask with oxygen for 70 to 80 seconds, the method further comprises:
   forming the photoetching mask on the metal layer, wherein
   the thickness of the photoetching mask formed on the metal layer in the half exposure area of the mask plate ranges from 4000 Å to 5500 Å.

\* \* \* \* \*